(12) United States Patent
Noguchi

(10) Patent No.: US 8,575,602 B2
(45) Date of Patent: Nov. 5, 2013

(54) ACTIVE MATRIX SUBSTRATE AND ORGANIC EL DISPLAY DEVICE

(75) Inventor: Noboru Noguchi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/501,436

(22) PCT Filed: May 27, 2010

(86) PCT No.: PCT/JP2010/058980
§ 371 (c)(1),
(2), (4) Date: Apr. 11, 2012

(87) PCT Pub. No.: WO2011/048838
PCT Pub. Date: Apr. 28, 2011

(65) Prior Publication Data
US 2012/0199854 A1  Aug. 9, 2012

(30) Foreign Application Priority Data
Oct. 20, 2009  (JP) ................................. 2009-241319

(51) Int. Cl.
*H01L 51/52* (2006.01)

(52) U.S. Cl.
USPC ............................................. 257/40; 257/88

(58) Field of Classification Search
USPC ................................................... 257/40, 88
See application file for complete search history.

(56) References Cited

U.S. PATENT DOCUMENTS

| | | | |
|---|---|---|---|
| 6,246,179 B1 * | 6/2001 | Yamada | 315/169.3 |
| 6,617,608 B2 * | 9/2003 | Bae et al. | 257/40 |
| 6,900,470 B2 * | 5/2005 | Kobayashi et al. | 257/88 |
| 7,122,832 B2 * | 10/2006 | Nishikawa | 257/59 |
| 7,190,114 B2 * | 3/2007 | Yamagata et al. | 313/509 |
| 7,301,279 B2 * | 11/2007 | Sakakura et al. | 313/509 |

(Continued)

FOREIGN PATENT DOCUMENTS

| | | |
|---|---|---|
| JP | 2005-31630 A | 2/2005 |
| JP | 2006-30635 A | 2/2006 |

(Continued)

OTHER PUBLICATIONS

International Search Report received for PCT Patent Application No. PCT/JP2010/058980, mailed on Jul. 6, 2010, 6 pages (2 pages of English translation and 4 pages of PCT Search Report).

*Primary Examiner* — Eugene Lee
(74) *Attorney, Agent, or Firm* — Morrison & Foerster LLP

(57) ABSTRACT

The present invention provides an active matrix substrate driven by an analog gray scale method, and an organic EL display device, in which decrease in response speed of a current emissive element is suppressed. The active matrix substrate of the present invention is driven by an analog gray scale method and is provided with a pixel that has a current emissive element and a transistor that supplies current to the current emissive element. The pixel further has a compensation circuit for compensating variability of threshold voltage in the transistor; the current emissive element has a pixel electrode electrically connected to the transistor; a gate electrode of a transistor that makes up the compensation circuit forms a region covered with the pixel electrode; and a part or the entirety of the gate electrode that is positioned within the region is provided in a wiring layer that is lower than a wiring layer directly below the pixel electrode.

4 Claims, 12 Drawing Sheets

(56) References Cited

U.S. PATENT DOCUMENTS

| | | | |
|---|---|---|---|
| 7,372,076 B2 * | 5/2008 | Nishi et al. | 257/59 |
| 7,485,896 B2 * | 2/2009 | Yamazaki et al. | 257/79 |
| 7,682,856 B2 * | 3/2010 | Ishii | 438/30 |
| 7,732,824 B2 * | 6/2010 | Konuma et al. | 257/83 |
| 7,759,859 B2 * | 7/2010 | Arai et al. | 313/504 |
| 7,834,538 B2 * | 11/2010 | Yamazaki et al. | 313/501 |
| 2005/0017934 A1 | 1/2005 | Chung et al. | |
| 2005/0116631 A1 * | 6/2005 | Kim et al. | 313/506 |
| 2006/0108916 A1 | 5/2006 | Koo et al. | |
| 2009/0046041 A1 | 2/2009 | Tanikame | |

FOREIGN PATENT DOCUMENTS

| | | |
|---|---|---|
| JP | 2006-47999 A | 2/2006 |
| JP | 2007-148218 A | 6/2007 |
| JP | 2007-316510 A | 12/2007 |
| JP | 2008-83117 A | 4/2008 |
| JP | 2009-47765 A | 3/2009 |

* cited by examiner

PRIOR ART

PRIOR ART

ACTIVE MATRIX SUBSTRATE AND ORGANIC EL DISPLAY DEVICE

CROSS REFERENCE TO RELATED APPLICATIONS

This is a U.S. National Phase patent application of PCT/JP2010/058980, filed May 27, 2010, which claims priority to Japanese Patent Application No. 2009-24139, filed Oct. 20, 2009, each of which is hereby incorporated by reference in the present disclosure in its entirety.

TECHNICAL FIELD

The present invention relates to an active matrix substrate and to an organic EL display device. More specifically, the present invention relates to an active matrix substrate that is suitable for a display device provided with a current emissive element such as an organic EL element, and to an organic EL display device provided with the active matrix substrate.

BACKGROUND ART

Driving schemes in organic EL display devices include two types, passive matrix and active matrix schemes. Active matrix is the mainstream driving scheme at present, in particular in large display devices.

Ordinarily, the pixels in an active-matrix organic EL display device comprise each one organic EL element that is provided with a switching transistor for transmission of data signal, and with a driving transistor that drives the organic EL element on the basis of a data signal that is transmitted by the switching transistor (for instance, Patent Document 1). Parasitic capacitance arises between these members, which are provided in the pixel, and wiring layers, for instance scanning lines, signal lines and the like. Methods have been proposed in which the display defect known as crosstalk, which derives from this parasitic capacitance, is suppressed by arranging a metallic pattern that constitutes an electric field shield for scanning lines and signal lines (for instance, Patent Document 2).

If the threshold voltage of the driving transistor of each pixel exhibits variability, driving of the driving transistor of each pixel with the same gate voltage results in variability of the current value that is supplied from the driving transistor to the organic EL element. This is one cause of display unevenness. Known methods for solving this problem include, for instance, area gray scale expression or time-division gray scale expression by digital gray scale driving. In the case of analog gray scale driving, methods have been disclosed wherein fluctuation in the threshold voltage of the driving transistor is detected for each pixel, and a so-called compensation circuit is formed that compensates that fluctuation (for instance, Patent Document 3).

PRIOR ART REFERENCES

[Patent Documents]
 Patent Document 1: JP 2006-47999 (page 2)
 Patent Document 2: JP 2006-30635 (pages 2 to 4)
 Patent Document 3: JP 2005-31630 (page 2 and 10)

DISCLOSURE OF THE INVENTION

The purpose of the abovementioned method of arranging a metallic pattern that constitutes an electric field shield was not lowering parasitic capacitance inside pixels.

The above-described method of forming a compensation circuit is a pixel circuit configuration and driving method that allows compensating a threshold value by itself, but the circuit configuration was complex, and parasitic capacitance formed inside the pixels, which gave rise to potential fluctuations that in turn detracted from response speed in the panel.

The operation mechanism of a conventional organic EL display device provided with a compensation circuit is explained next.

FIGS. 8 and 9 are plan-view schematic diagrams illustrating a pixel of a conventional organic EL display device provided with a compensation circuit. The pixel has six transistors (T1 to T6), two capacitors (C1 and C2), and one organic EL element OLED. In FIG. 8, scan[n−1] and scan[n] denote, respectively, an [n−1]-th and an [n]-th scanning line; Vini[n] denotes an [n]-th initialization voltage line; and em[n] denotes an [n]-th emission control line. The transistor T1 responds to a scan signal inputted from the scanning line scan[n−1], and a data signal stored in the capacitors C1, C2 is discharged via the initialization voltage line Vini[n], to initialize as a result the gate voltage of the transistor T4. The transistor T2 compensates variability in the threshold voltage of the transistor T4. The transistor T3 responds to the scan signal inputted from the scanning line scan[n], and performs switching of the data signal inputted from the signal line data. The transistor T4 responds to the data signal inputted via the transistor T3, and decides the amount of current that is supplied to the organic EL element OLED. The transistor T5 responds to the emission signal inputted from the emission control line em[n], and performs switching of the current that is supplied to the transistor T4 from the power source line ELVDD. The transistor T6 responds to the emission signal inputted from the emission control line em[n], and performs switching of the current that is supplied to the organic EL element OLED from the transistor T4. The capacitor C1 stores gate voltage that is inputted to the transistor T4. The purpose of the capacitor C2 is to assist the capacitor C1. The organic EL element OLED emits light in accordance with the current that is supplied from the transistor T4. The anode of the organic EL element OLED is connected to the drain of the transistor T6, and the cathode of the organic EL element OLED is connected to a power source line ELVSS.

Upon observation of response between gray scales in the organic EL display device illustrated in FIGS. 8 and 9, a phenomenon of a step-like response is observed wherein the original brightness cannot be reached in a frame (one frame corresponds to a 16.7 ms display period) immediately after switching of gray scale, but is eventually reached in subsequent frames.

FIG. 10 is a graph illustrating measurement results of response characteristic of a conventional organic EL display device provided with a compensation circuit. FIG. 10 illustrates results of an instance where black display changes into white display. As illustrated in FIG. 10, brightness is very low at the frame immediately after change from black display to white display, as compared with subsequent frames. This result indicates that the response time (time required to reach 90% or more of the brightness to be originally reached) is longer than the time of one frame. When the response time is longer than the time of one frame, an unwanted line-like pattern called "tailing" is seen upon screen scroll (upon video display), which is a cause of loss of display performance. Conventional organic EL display devices having a compensation circuit, thus, had room for improvement in that the high-speed response characteristics of the organic EL element failed to be brought out.

In the light of the above, it is an object of the present invention to provide an active matrix substrate driven by an analog gray scale method, and an organic EL display device, in which decrease in response speed of a current emissive element is suppressed.

Means for Solving the Problems

The inventor conducted various studies on active matrix substrates driven by an analog gray scale method in which decrease in response speed of a current emissive element is suppressed, and came to focus on regions in which a gate electrode of a transistor (driving transistor) that supplies current to a current emissive element is covered with a pixel electrode of the current emissive element. The path of current that is supplied to a current emissive element from a transistor that supplies current to the current emissive element is preferably as short as possible. Therefore, the current emissive element and the transistor are often disposed close to each other. In terms of securing an emission region that is as wide as possible, the area ratio of the pixel electrode is normally set to be high. For the above reasons, the pixel electrode of the current emissive element and the gate electrode of the transistor that supplies current to the current emissive element are often disposed overlappingly (in superposition), and parasitic capacitance is thus likely to occur. The number of members disposed in the pixel is substantial, and the layout of the various members is complex, in particular, in pixels that are provided with a compensation circuit for compensating variability of threshold voltage in the transistor that supplies current to the current emissive element. Therefore, the region in which the gate electrode of the transistor that supplies current to the current emissive element is covered with the pixel electrode of the current emissive element and is likely to become larger. Also, pixel layout is complex in a case where a compensation circuit is made up of a plurality of transistors, as in the organic EL display device illustrated in FIGS. 8 and 9. As a result, the pixel electrode of the current emissive element covers more readily the gate electrode of the transistor that supplies current to the current emissive element, and in some instances, the pixel electrode may cover the entirety of the gate electrode. Focusing now on the wiring layer, a scanning line is formed in a first wiring layer, and hence wiring (for instance, a gate electrode 102 of the transistor T4 that supplies current to the current emissive element) for forming capacitance and for connection between transistors is normally formed at a wiring layer directly below a pixel electrode that is an overlying wiring layer. In the organic EL display device illustrated in FIGS. 8 and 9, parasitic capacitance (hereafter notated as Cad) is formed between the gate electrode 102 of the transistor T4 and a pixel electrode 103 (anode) of the organic EL element OLED. In the light of the measurement results of FIG. 10, the inventor speculated that this Cad might be a cause of the step-like response.

To verify the above study results, simulation measurements of response waveforms were performed in the organic EL display device illustrated in FIGS. 8 and 9, with changes in Cad. FIGS. 11, 12 and 13 are graphs illustrating response waveforms of current as obtained by simulation measurements of response waveforms in cases where Cad was 0, 20 and 60 fF, respectively.

As illustrated in FIGS. 11 to 13, no step-like response is found when Cad is 0 fF; however, a step-like response arises for Cad of 20 and 60 fF. The regions surrounded by the broken line in FIG. 12 and FIG. 13 denote sites at which step-like response occurs. It is found that the difference between current in the 1st frame and current in the 2nd frame increases as Cad rises from 20 fF to 60 fF.

The relationship between Cad and current supplied to the organic EL element was evaluated on the basis of the results of the above response waveform simulation. FIG. 14 is a graph illustrating the relationship between Cad and current supplied to the organic EL element. FIG. 14 reflects also the results of simulations performed for Cad other than 0, 20 and 60 fF. In FIG. 14, the "current ratio" in the ordinate axis denotes current ratio between the 1st frame and the 3rd frame after switching from black display to white display or half-tone display, and is a value resulting from dividing the mean value of current in the 1st frame by the mean value of current in the 3rd frame.

The results illustrated in FIG. 14 indicate that the current ratio tends to decrease as Cad becomes greater. That is, the difference between current in the 1st frame and current in the 3rd frame tends to increase as Cad becomes greater.

Brightness in the organic EL element is proportional to the current that is supplied by the transistor that supplies current to the current emissive element. That is, the current ratio in FIG. 14 is equal to the brightness ratio in the 1st frame and the 3rd frame. Therefore, the current ratio in FIG. 14 must exceed 0.9 in order to prevent the occurrence of a step-like response characteristic through shortening of the response time to be shorter than the time of one frame. The results illustrated in FIG. 14 suggest that the current ratio exceeds 0.9 in a case where Cad is smaller than about 20 fF upon switching from black display to white display, and in a case where Cad is smaller than about 16 fF upon switching from black display to half-tone display. In the organic EL display device illustrated in FIGS. 8 and 9, however, the current ratio was 0.9 or less, as is clear in FIG. 10, and the response time was longer than the time of one frame.

An explanation follows next on a driving method of the pixel illustrated in FIGS. 8 and 9, and on the reasons for the occurrence of a step-like response on account of Cad. FIG. 15 is a timing chart of the 1st frame in the pixel illustrated in FIGS. 8 and 9. In FIG. 15, displacement in the vertical direction denotes voltage change in respective wirings, while displacement from left to right denotes passage of time. In FIG. 15 the times in the various wirings have been arrayed vertically to facilitate a comparison between the voltages at the respective wirings at a same point in time. In FIG. 15, Vgs denotes the gate voltage of the transistor T4.

Three steps, namely an initialization period a, a program period b and an emission period c, are sequentially provided in one frame, in this order. The various steps are explained next.

Firstly, in the initialization period a, the scanning line scan [n−1] is switched on, and charge (data signal) stored in the capacitors C1, C2 is discharged via the initialization voltage line Vini[n]. The gate voltage of the transistor T4 is initialized as a result.

In the program period b, next, the scanning line scan[n] is switched on, and data on each gray scale inputted from the signal line data is written in the transistor T4, to compensate thereby the threshold voltage of the transistor T4. At this time, the gate voltage of the transistor T4 takes on a value that is lower, by the threshold voltage (Vth) of the transistor T4, than the voltage (V data) inputted from the signal line data. Charge corresponding to the gate voltage of the transistor T4 is stored in the capacitors C1, C2.

In the emission period c, the emission control line em[n] is switched on, and current according to the gate voltage of the transistor T4, i.e. according to Vdata-Vth, is supplied to the organic EL element OLED, whereupon the organic EL element OLED emits light as a result.

An explanation follows next on the relationship between the gate voltage of the transistor T4 and the current that is supplied to the organic EL element OLED from the transistor T4. FIG. 16 is a schematic diagram illustrating a TFT characteristic of the transistor T4 (transistor that supplies current to the current emissive element). In FIGS. 16, V8 (V) and V255 (V) denote, respectively, the gate voltage (Vgs) of the transistor T4 in cases where a gray scale value is 8 and 255, respectively.

In the program period b, the threshold voltage of the transistor T4 is compensated, and Vdata-Vth is set as the gate voltage of the transistor T4. In the emission period c, current flows according to the gate voltage of the transistor T4. The gate voltage (Vgs) of the transistor T4 during emission obeys Vgs_1<Vgs_2 when a relationship V data_1<V data_2 holds. That is, the gate voltage (Vgs) of the transistor T4 increases when the voltage (Vdata) inputted from the signal line data increases, and, as a result, a current value (Ids) that flows between the source and drain of the transistor T4 becomes smaller. In the TFT characteristic illustrated in FIG. 16, Vgs_1 corresponds to V255 (V) and Vgs_2 corresponds to V8 (V).

The reason for the occurrence of a step-like response on account of Cad is explained next. Focusing on the point in time at which the emission control line em[n] is switched on in the emission period c of FIG. 15, the gate voltage (Vgs) of the transistor T4 rises by a width denoted by α. This is deemed to arise from the capacitive component of the organic EL element OLED itself. At a non-display period (period at which the emission control line em[n] is off), charge cannot be drawn from the pixel electrode of the organic EL element OLED. When the emission control line em[n] is switched on, therefore, the Vgs of the transistor T4 rises up in the voltage direction of the previous frame, via Cad, to yield a voltage that is different from the original voltage.

From a next frame onwards, the voltage in the pixel electrode of the organic EL element OLED results from adding the rise (or fall) fraction to the original voltage. Therefore, the voltage comes closer to the original gate voltage, with less influence from a previous frame as compared with the initial frame upon gray scale switching. The initial frame and the next frame exhibit thus a step-like response characteristic upon gray scale switching.

It is found thus that Cad must be lowered in order to eliminate the step-like response characteristic. As a result of further study, the inventor found that Cad is reduced, and the occurrence of step-like response characteristic suppressed, by arranging the gate electrode of a transistor that supplies current to a current emissive element in such a manner that the gate electrode stands farther from a pixel electrode of the current emissive element. The inventor found that the above problems could be admirably solved thereby, and arrived thus at the present invention.

Specifically, the present invention is an active matrix substrate driven by an analog gray scale method, including a pixel that has a current emissive element and a transistor that supplies current to the current emissive element, wherein the pixel further has a compensation circuit for compensating variability of threshold voltage in the transistor, the current emissive element has a pixel electrode electrically connected to the transistor, and a gate electrode of a transistor that makes up the compensation circuit forms a region covered with the pixel electrode, a part or the entirety of the gate electrode that is positioned within the region being provided in a wiring layer that is lower than a wiring layer directly below the pixel electrode.

The configuration of the active matrix substrate of the present invention is not especially limited by other components as long as it essentially includes such components.

Preferable embodiments of the active matrix substrate of the present invention are mentioned in more detail below.

One preferred mode of the active matrix substrate of the present invention may be a mode wherein a part or the entirety of the gate electrode is provided in a first wiring layer being a wiring layer closest to the substrate. As a result, Cad can be sufficiently reduced, and the influence of a previous frame can be eliminated. Occurrence of a step-like response characteristic can be prevented as a result.

One preferred mode of the active matrix substrate of the present invention may be a mode wherein, in the active matrix substrate, a shield electrode is provided in a wiring layer between the pixel electrode and a wiring layer in which the gate electrode is provided, and the shield electrode forms a region covering the gate electrode. This mode can be regarded as a mode in which the shield electrode is formed in such a way so as to cover the gate electrode. In such a mode, the shield electrode is formed between the gate electrode and the pixel electrode. Hence, an organic EL display device can be provided that is excellent in display performance and that is not influenced by the electrodes at both ends that form the Cad.

The shield electrode can be connected to a power source line or the like.

Pixel layout is complex in a case where a compensation circuit is made up of a plurality of transistors, as in the organic EL display device illustrated in FIGS. 8 and 9. Therefore, the gate electrode 102 is likely to cover scanning lines and so forth that are formed at the first wiring layer. In this case, therefore, the surface area of the portion of the gate electrode 102 that is formed in the second wiring layer (wiring layer directly below the pixel electrode 103) tends to increase, as does Cad. In the present invention, Cad can be reduced, and hence the problem of the abovementioned configuration can be effectively solved.

One preferred mode of the active matrix substrate of the present invention may be a mode wherein the shield electrode is provided in the second wiring layer. The effect of the present invention can be brought out yet more fully as a result.

One preferred mode of the active matrix substrate of the present invention may be a mode wherein the gate electrode forms a region covering a power source line. This mode allows reducing Cad and suppressing the occurrence of a step-like response characteristic, and makes it possible for capacitance (charge corresponding to the gate voltage of the transistor T4) to be formed between wiring layers without problems.

In a preferred mode, for instance, the gate electrode is formed at the first wiring layer and the second wiring layer, via a contact hole, a power source layer is formed at the first wiring layer, and a region is formed at which there overlap a gate electrode formed in the second wiring layer and a power source line formed at the first wiring layer.

The present invention is also an organic EL display device provided with the active matrix substrate of the present invention, wherein the current emissive element in the pixel is an organic EL element, and the pixel electrode of the current emissive element in the pixel is an anode or cathode of the organic EL element. In the active matrix substrate of the present invention, Cad is reduced, and occurrence of a step-like response characteristic is suppressed. An organic EL display device having excellent display performance can be realized as a result.

The aforementioned modes may be employed in appropriate combination as long as the combination is not beyond the spirit of the present invention.

Effect of the Invention

By virtue of the active matrix substrate and organic EL display device of the present invention there can be provided an active matrix substrate driven by an analog gray scale method, and an organic EL display device, in which decrease in response speed of a current emissive element is suppressed.

MODES FOR CARRYING OUT THE INVENTION

In the present description, "pixel electrode" denotes an electrode electrically connected to a drain electrode of a transistor that supplies current to a current emissive element, from among the electrodes comprised in the current emissive element. In the case of an organic EL element, the pixel electrode may be an anode or a cathode.

In the present description, the "current emissive element" is not particularly limited and need only be an element that emits light by itself on account of supplied current. Examples of current emissive elements in which the present invention is particularly effective include, for instance, planar current emissive elements such as organic EL elements, inorganic EL elements and the like.

In the present description, a "wiring layer directly below the pixel electrode" denotes a first wiring layer, counting from the pixel electrode, from among the wiring layers that are disposed further towards the substrate side than the pixel electrode. Ordinarily, interlayer dielectrics are disposed between the pixel electrode and the wiring layers. Therefore, a "wiring layer directly below the pixel electrode" denotes also a "wiring layer adjacent to the pixel electrode across an interlayer dielectric".

In the present description, a configuration wherein layer A and layer B are at a same level indicates at least one instance from among a configuration wherein an underlying layer in contact with layer A and an underlying layer in contact with layer B is a shared layer, or a configuration wherein an overlying layer in contact with layer A and an overlying layer in contact with layer B are a shared layer, but preferably denotes an instance where both such configurations are satisfied. The wiring layer denotes a layer of wiring that is used as a conductor inside and outside the pixel. The first wiring layer denotes a wiring layer closest to the substrate, i.e. a wiring layer that stands first, counting from the substrate, from among the wiring layers that are disposed further on the pixel electrode side than the substrate. Similarly, the second wiring layer is the wiring layer that stands second counting from the substrate. The wiring layer is ordinarily low-resistance wiring (metal wiring). For instance a wiring layer that forms a scanning line is the first wiring layer, and a wiring layer that forms a data line is the second wiring layer. A semiconductor layer is ordinarily present in the form of a semiconductor portion such as a channel or the like and a pattern-like portion having lowered resistance through ion implantation via a mask or the like. A semiconductor layer having thus a semiconductor as a material and that makes distinct use of semiconductor characteristics or conductor characteristics, depending on the application, does not constitute a wiring layer in the present description.

Figure 8:
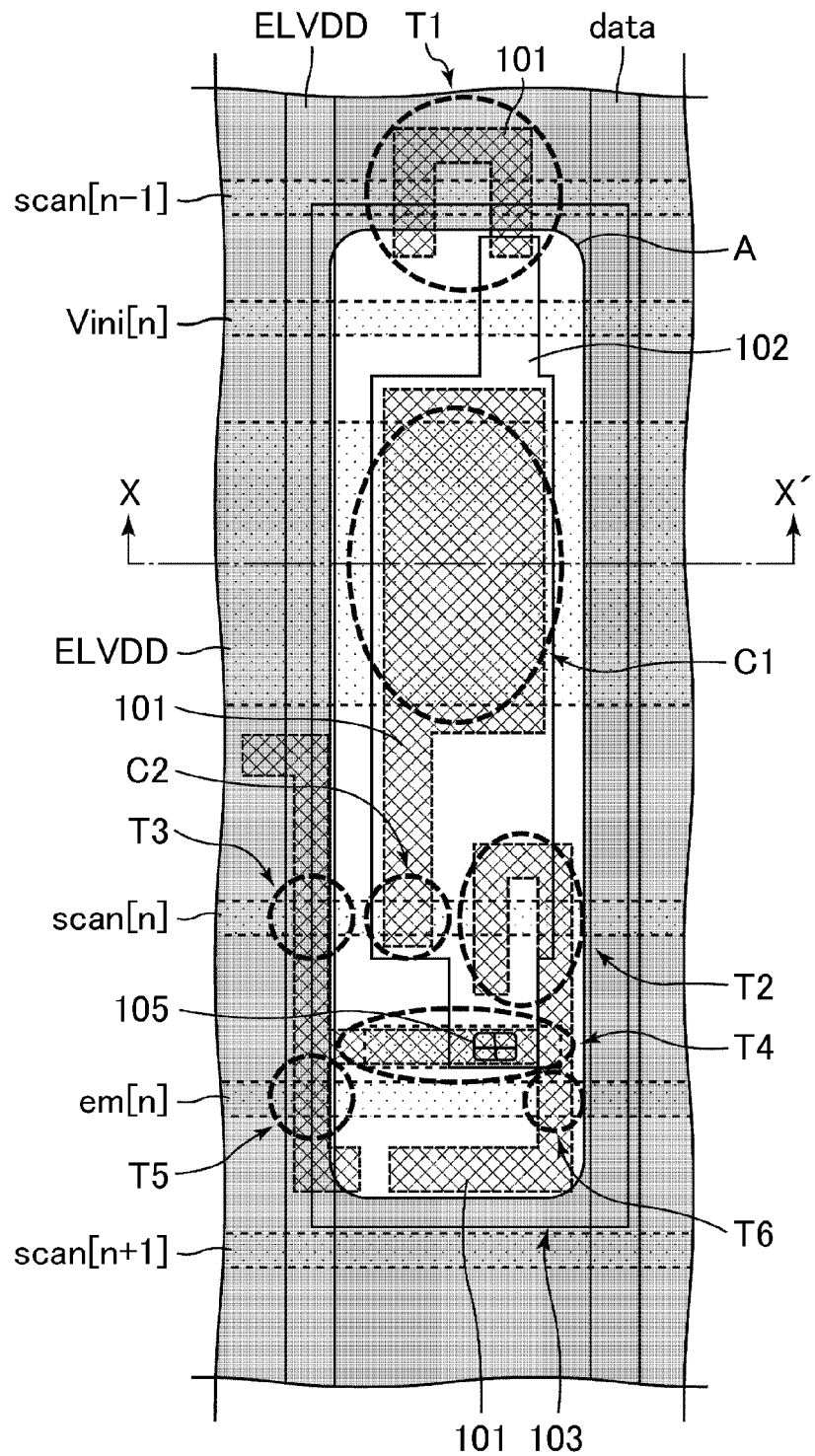
FIG. 8 is a plan-view schematic diagram illustrating a pixel of a conventional organic EL display device provided with a compensation circuit.
Figure 9:
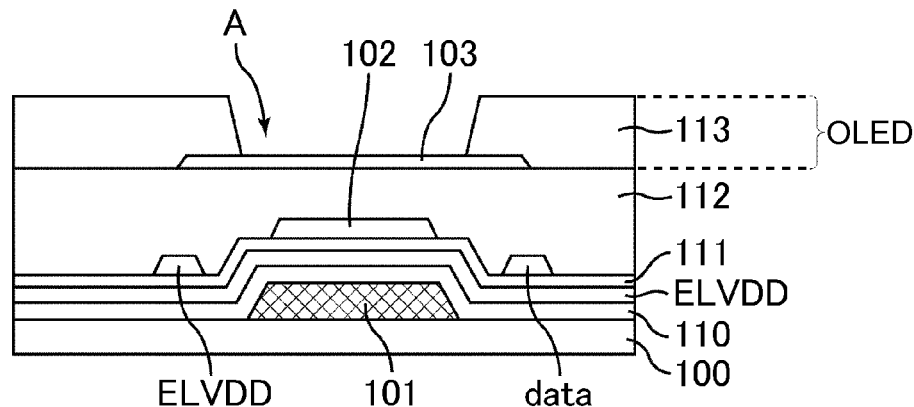
FIG. 9 is a cross-sectional schematic diagram along line X-X' in FIG. 8.
Figure 10:
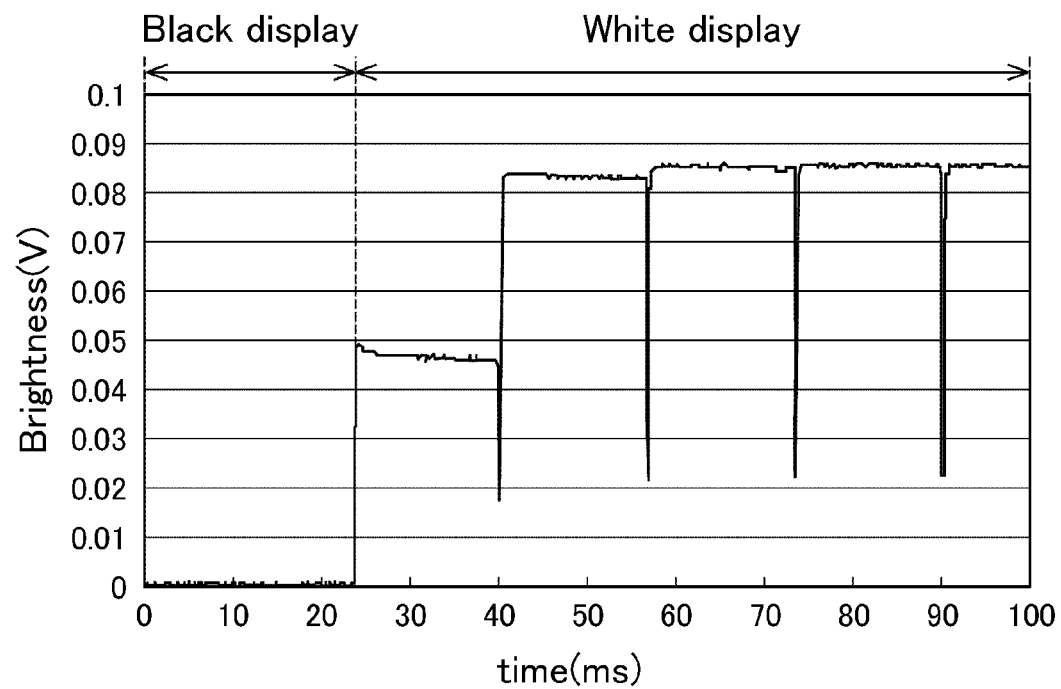
FIG. 10 is a graph illustrating measurement results of response characteristic of a conventional organic EL display device provided with a compensation circuit.
Figure 11:
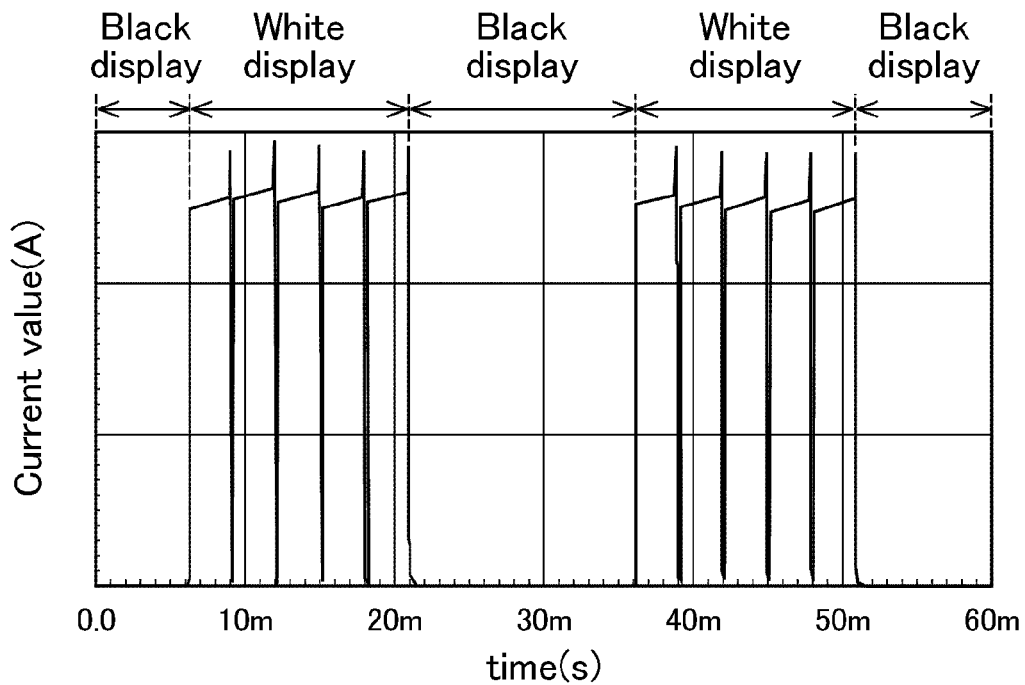
FIG. 11 is a graph illustrating a current response waveform obtained by simulation of a response waveform in a case where Cad is 0 fF.
Figure 12:
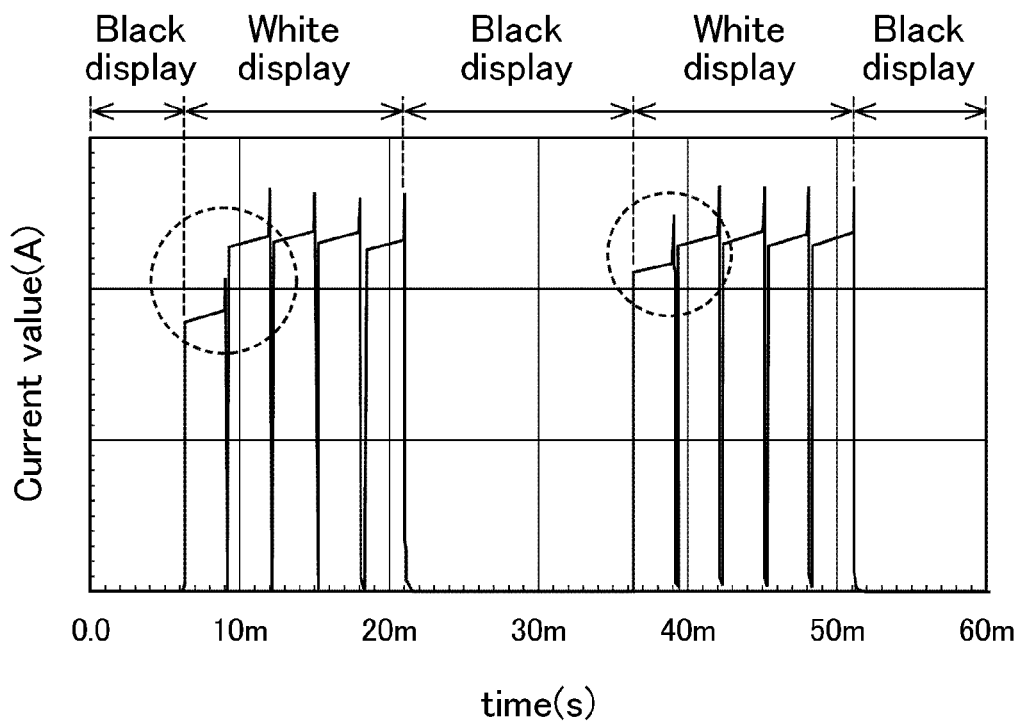
FIG. 12 is a graph illustrating a current response waveform obtained by simulation of a response waveform in a case where Cad is 20 fF.
Figure 13:
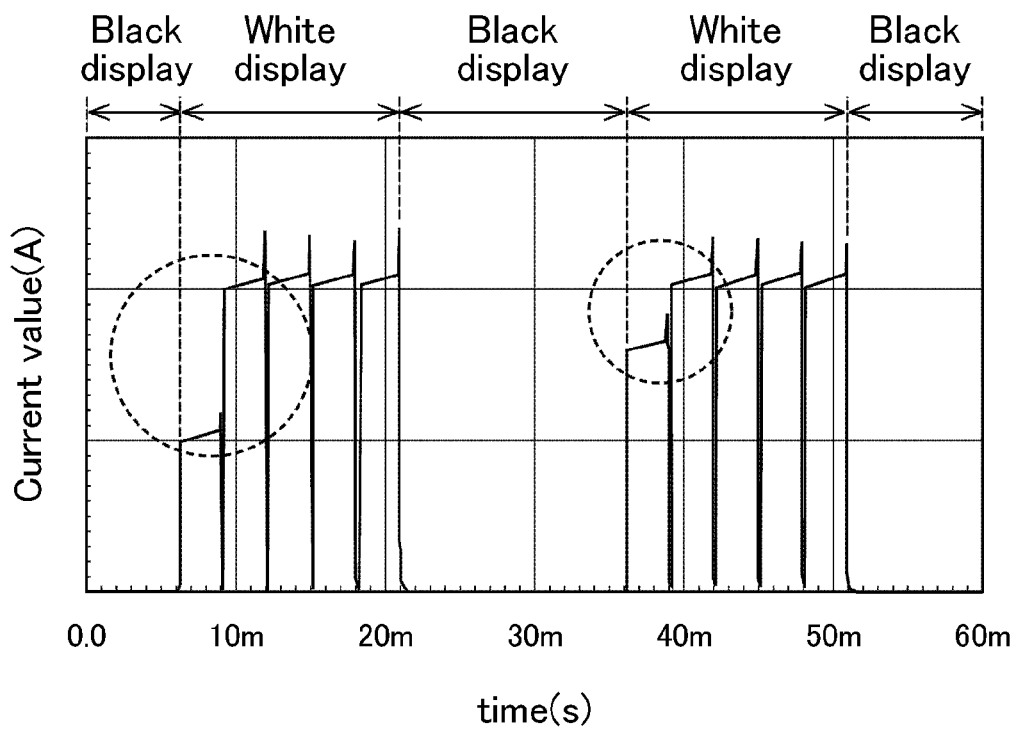
FIG. 13 is a graph illustrating a current response waveform obtained by simulation of a response waveform in a case where Cad is 60 fF.
Figure 14:
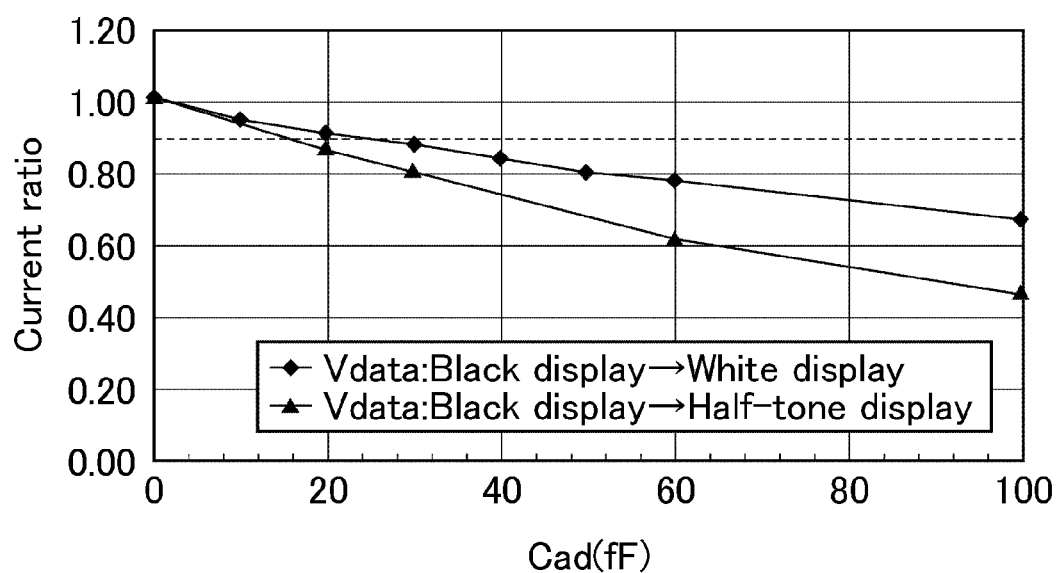
FIG. 14 is a graph illustrating the relationship between Cad and current supplied to an organic EL element.
Figure 15:
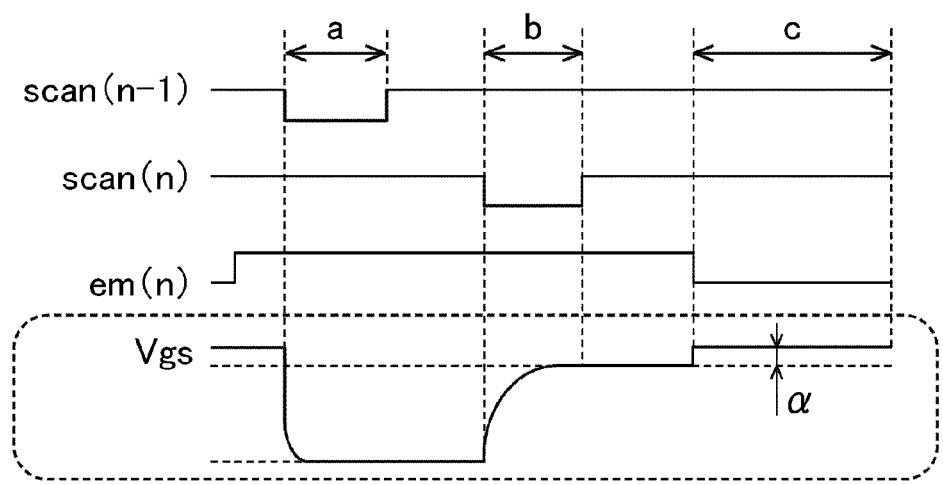
FIG. 15 is a timing chart of a 1st frame in a pixel of a conventional organic EL display device.
Figure 16:
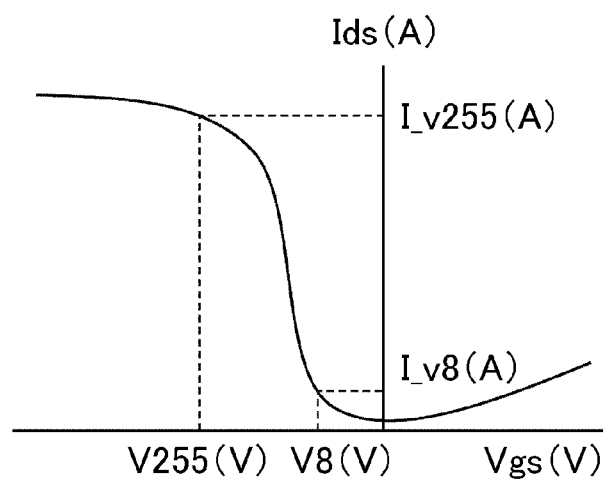
FIG. 16 is a schematic diagram illustrating a TFT characteristic of a transistor T4 (transistor that supplies current to a current emissive element).

In plan-view schematic diagrams that illustrate a pixel of an organic EL display device, the first wiring layer is depicted by a broken line and the pixel electrode and the second wiring layer are depicted by solid lines. FIG. 8 and FIG. 9 illustrate a semiconductor layer 101 of a TFT, but the semiconductor layer 101 is depicted with a broken line.

The present invention will be mentioned in more detail referring to the drawings in the following embodiments, but is not limited to these embodiments.

(Embodiment 1)

Figure 1:
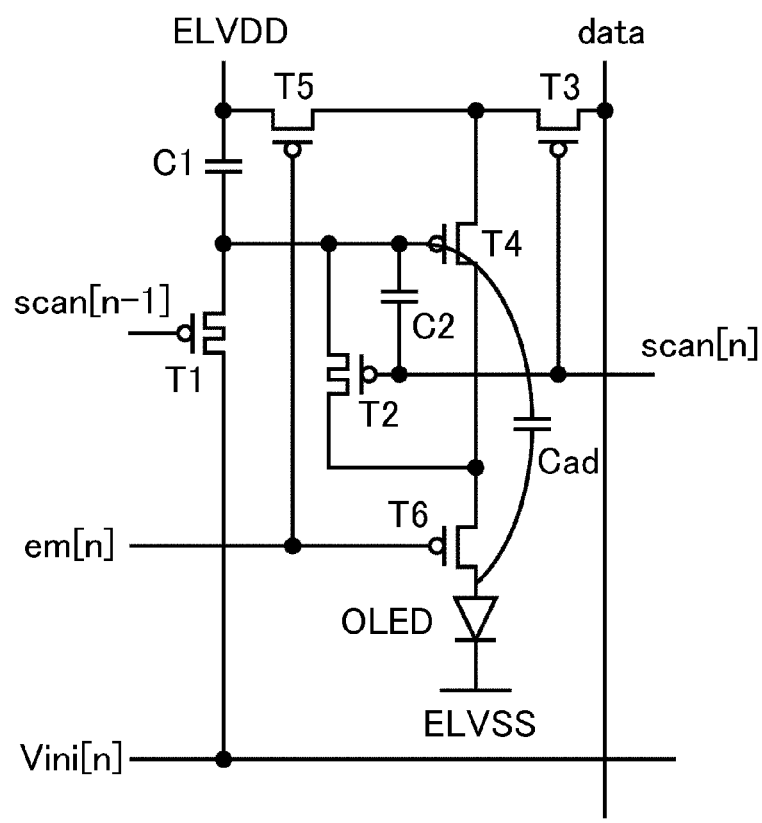
FIG. 1 is a circuit diagram illustrating a pixel of an organic EL display device in an embodiment.

FIG. 1 is a circuit diagram illustrating a pixel of an organic EL display device according to Embodiment 1.

Figure 2:
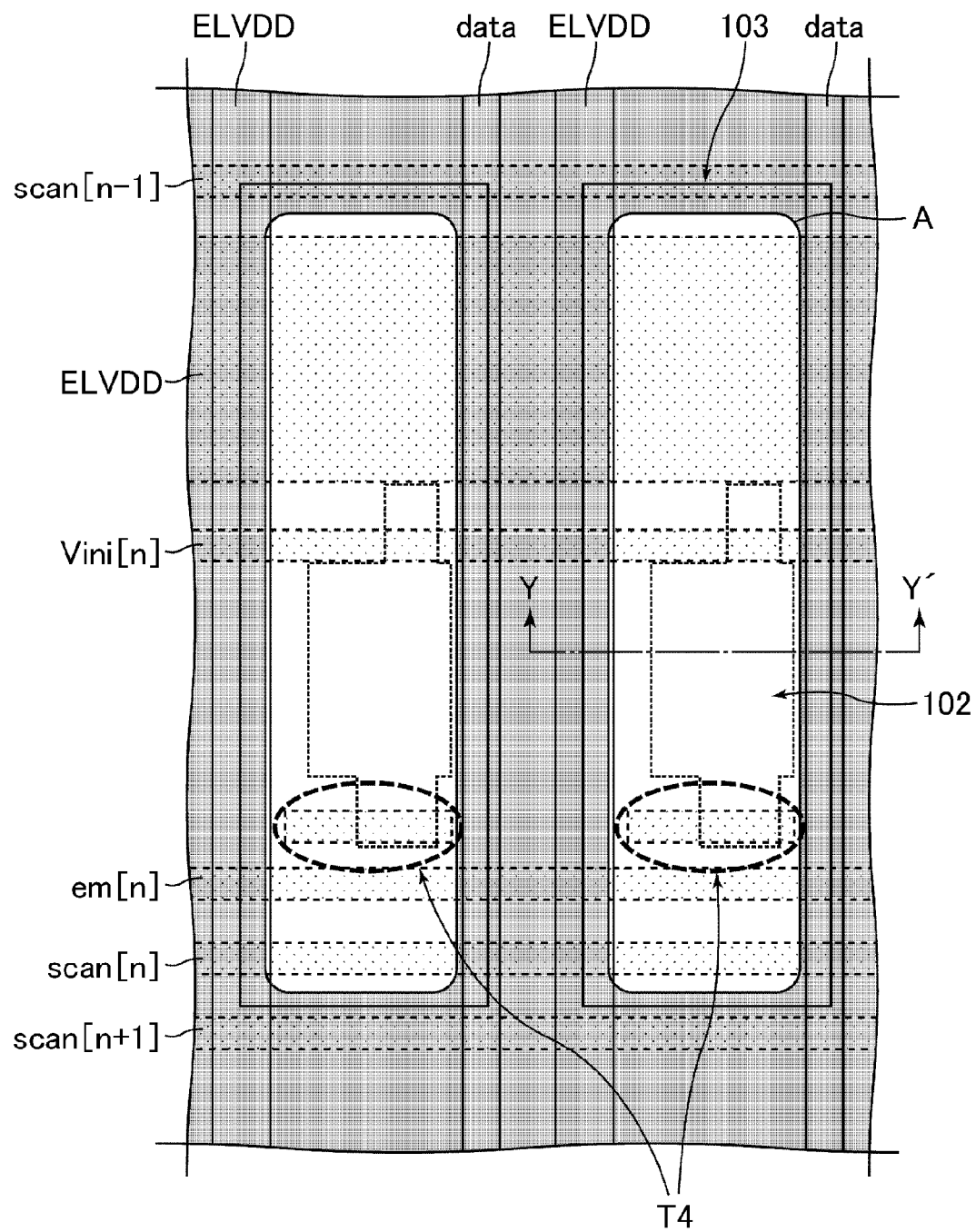
FIG. 2 is a plan-view schematic diagram illustrating a pixel in an organic EL display device of Embodiment 1.
Figure 3:
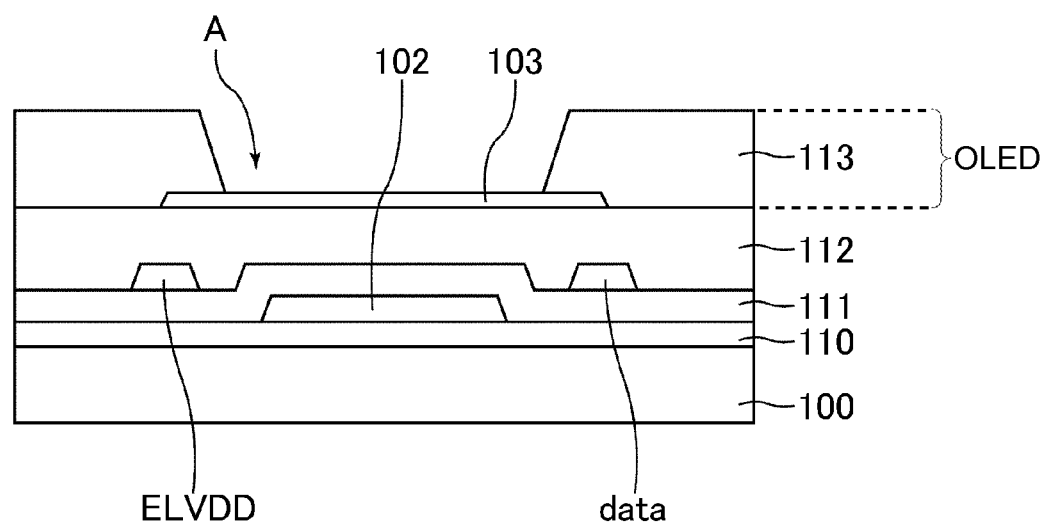
FIG. 3 is a cross-sectional schematic diagram along line Y-Y' in FIG. 2.

The arrangement relationship between the various members in the pixel illustrated in FIG. 1 is explained with reference to FIGS. 2 and 3. FIG. 2 is a plan-view schematic diagram illustrating a pixel in an organic EL display device provided with a compensation circuit of Embodiment 1. FIG. 3 is a cross-sectional schematic diagram along line Y-Y' in FIG. 2.

Scanning lines scan[n−1], scan[n], scan[n+1], an emission control line em[n] and an initialization voltage line Vini are formed in one same level (first wiring layer), and extend in the horizontal direction in FIG. 2. A signal line data, formed in a second wiring layer, extends in the vertical direction in FIG. 2.

The first wiring layer is disposed at a level closer to a substrate 100 than the second wiring layer. FIG. 2 and FIG. 3 illustrate a configuration wherein a gate electrode 102 is formed only at the first wiring layer.

One pixel electrode 103 that functions as an anode of the organic EL element OLED, is disposed at each region delimited by the scanning line scan[n−1], the scanning line scan [n+1], a power source line ELVDD and the signal line data. This region, which functions as one display unit, will also be referred to, in the present description, as a pixel. A semiconductor layer of the transistors T1 to T6 and the gate electrode 102 of the transistor T4 are disposed in the pixel. The region denoted by A is a pixel opening that functions as the display region of the organic EL display device.

As illustrated in FIG. 3, an interlayer dielectric 110, an interlayer dielectric 111 and an interlayer dielectric 112 are stacked, in this order, from the side of the substrate 100. The first wiring layer (gate electrode 102 of the transistor T4) is disposed between the interlayer dielectric 110 and the interlayer dielectric 111. The second wiring layer (power source line ELVDD and signal line data) is disposed between the interlayer dielectric 111 and the interlayer dielectric 112. The pixel electrode 103 is disposed on the interlayer dielectric 112. An end portion of the pixel electrode 103 is covered by an edge cover 113. Through covering of the periphery of the end portion of the pixel electrode 103, the edge cover 113 allows preventing shorts between the pixel electrode 103 and the cathode (power source line ELVSS) that is disposed opposite the pixel electrode 103 across an organic EL layer. The portion at which the edge cover 113 is not formed corresponds to the opening A.

In the organic EL display device of Embodiment 1, the gate electrode 102 of the transistor T4 that supplies current to the current emissive element forms a region covered with the pixel electrode 103, and is provided in a wiring layer that is lower than the wiring layer (second wiring layer) directly below the pixel electrode 103. Forming the gate electrode 102 this way allows reducing the capacitive component between the pixel electrode 103 and the gate electrode 102, and allows lowering Cad to 15 fF or less. Occurrence of a step-like response can be suppressed as a result, and there can be realized an organic EL display device having excellent display performance.

As illustrated in FIG. 3, the signal line data and the power source line ELVDD are formed at the wiring layer directly below the pixel electrode 103 (second wiring layer). The gate electrode 102 of the transistor T4 is provided in a wiring layer that is lower than the second wiring layer (i.e. at the first wiring layer being a wiring layer closest to the substrate).

(Embodiment 2)

The circuit diagram illustrating a pixel of an organic EL display device of Embodiment 2 is identical to that of Embodiment 1.

Figure 4:
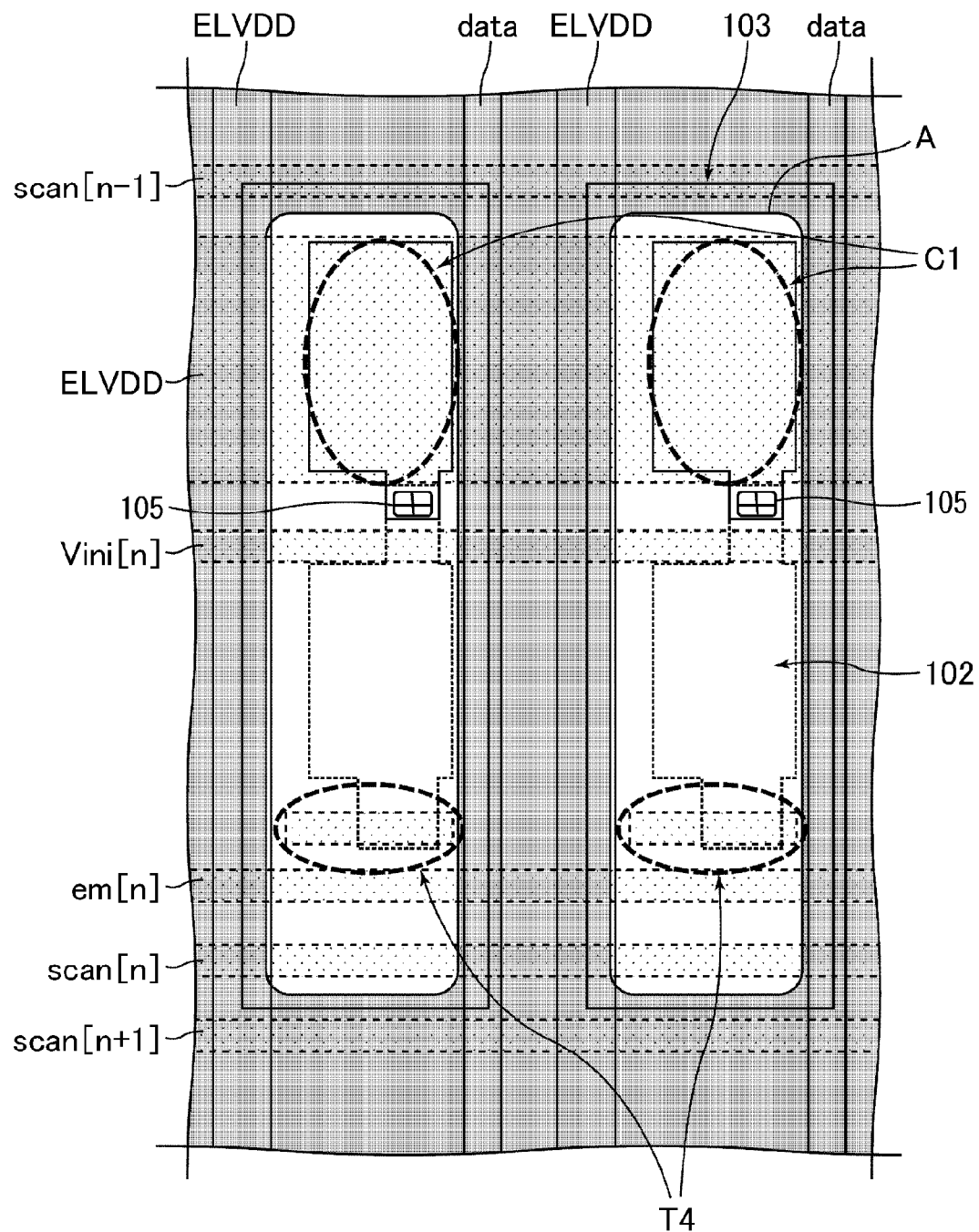
FIG. 4 is a plan-view schematic diagram illustrating a pixel in an organic EL display device of Embodiment 2.

FIG. 4 is a plan-view schematic diagram illustrating a pixel in an organic EL display device of Embodiment 2. In the organic EL display device of Embodiment 2, the gate electrode 102 of the transistor T4 is formed in a first wiring layer and a second wiring layer via a contact hole 105.

As illustrated in FIG. 4, the gate electrode 102 forms a region covered with the pixel electrode 103, and is provided in a wiring layer (first wiring layer) that is lower than the wiring layer directly below the pixel electrode 103; as a result, this allows lowering Cad to 15 fF or less, and suppressing the occurrence of a step-like response characteristic.

Also, capacitance (capacitor C1 formed through overlap of the gate electrode 102 and the power source line ELVDD) that is formed between the wiring layers can be formed without problems by virtue of the present configuration wherein part of the gate electrode 102 (portion formed at the second wiring layer) forms a region covering the power source line ELVDD that is formed at the first wiring layer.

An organic EL display device having excellent display performance can be realized as a result.

(Embodiment 3)

The circuit diagram illustrating a pixel of an organic EL display device of Embodiment 3 is identical to that of Embodiment 1.

Figure 5:
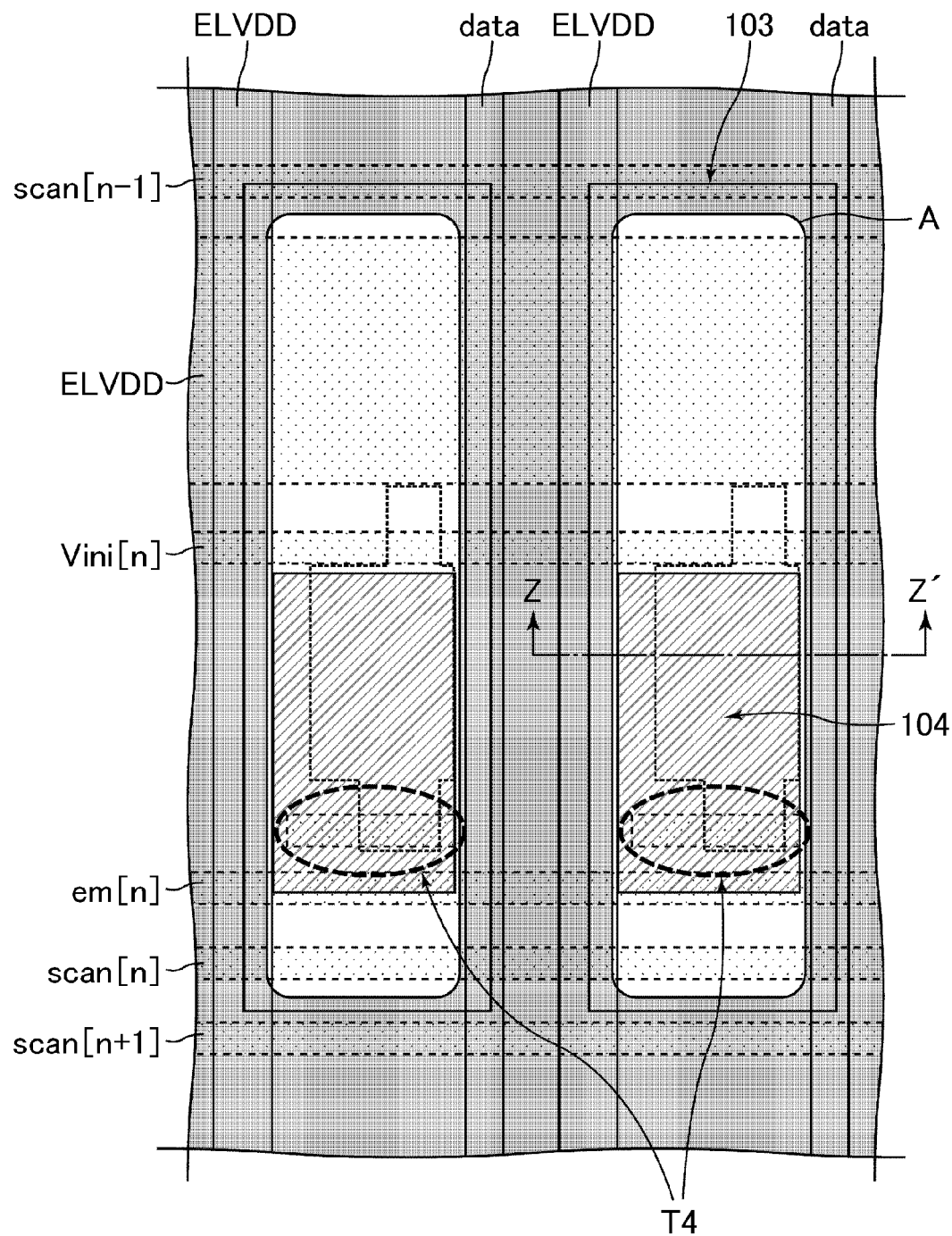
FIG. 5 is a plan-view schematic diagram illustrating a pixel in an organic EL display device of Embodiment 3.
Figure 6:
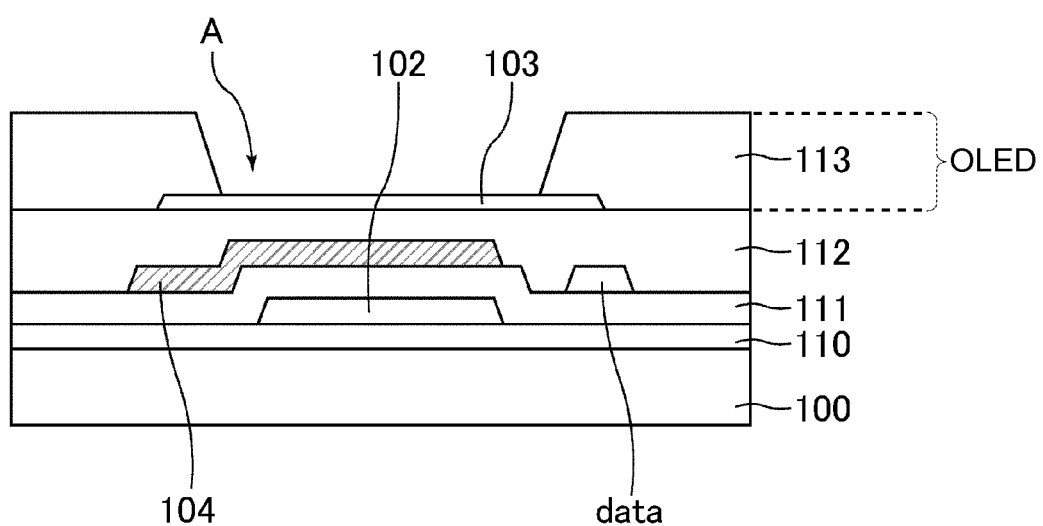
FIG. 6 is a cross-sectional schematic diagram along line Z-Z' in FIG. 5.

FIG. 5 is a plan-view schematic diagram illustrating a pixel in an organic EL display device of Embodiment 3. FIG. 6 is a cross-sectional schematic diagram along line Z-Z' in FIG. 5.

In the organic EL display device of Embodiment 3, the gate electrode 102 of the transistor T4 that supplies current to the current emissive element is provided in a first wiring layer that is lower than a wiring layer (second wiring layer) directly below the pixel electrode 103.

As illustrated in FIG. 5 and FIG. 6, the gate electrode 102 forms a region covered with the pixel electrode 103, and is provided in a wiring layer that is lower than the wiring layer directly below the pixel electrode 103; as a result, this allows lowering Cad to substantially 0 fF, and suppressing the occurrence of a step-like response characteristic.

As illustrated in FIG. 6, a shield electrode 104 is provided in a wiring layer (second wiring layer) between the pixel electrode 103 and a wiring layer (first wiring layer) that stands closest to the substrate and in which the gate electrode 102 is formed, such that the shield electrode 104 forms a region covering the gate electrode 102 that is provided in the first wiring layer.

Forming thus the shield electrode 104 at the second wiring layer above the gate electrode 102 allows preventing, yet more thoroughly, susceptibility to the influence of the electrodes at both ends where Cad is formed.

An organic EL display device having excellent display performance can be realized as a result.

The shield electrode 104 that is connected to the signal line data and the power source line ELVDD is formed at a wiring layer (second wiring layer) directly below the pixel electrode 103.

An end portion of the pixel electrode 103 is covered by the edge cover 113. The portion at which the edge cover 113 is not formed corresponds to the opening A. Interlayer dielectrics 112, 111, 110 are formed, respectively, between the pixel electrode 103 and the second wiring layer, between the second wiring layer and the first wiring layer (gate electrode 102), and between the first wiring layer and the substrate 100.

(Embodiment 4)

The circuit diagram illustrating a pixel of an organic EL display device of Embodiment 4 is identical to that of Embodiment 1.

Figure 7:
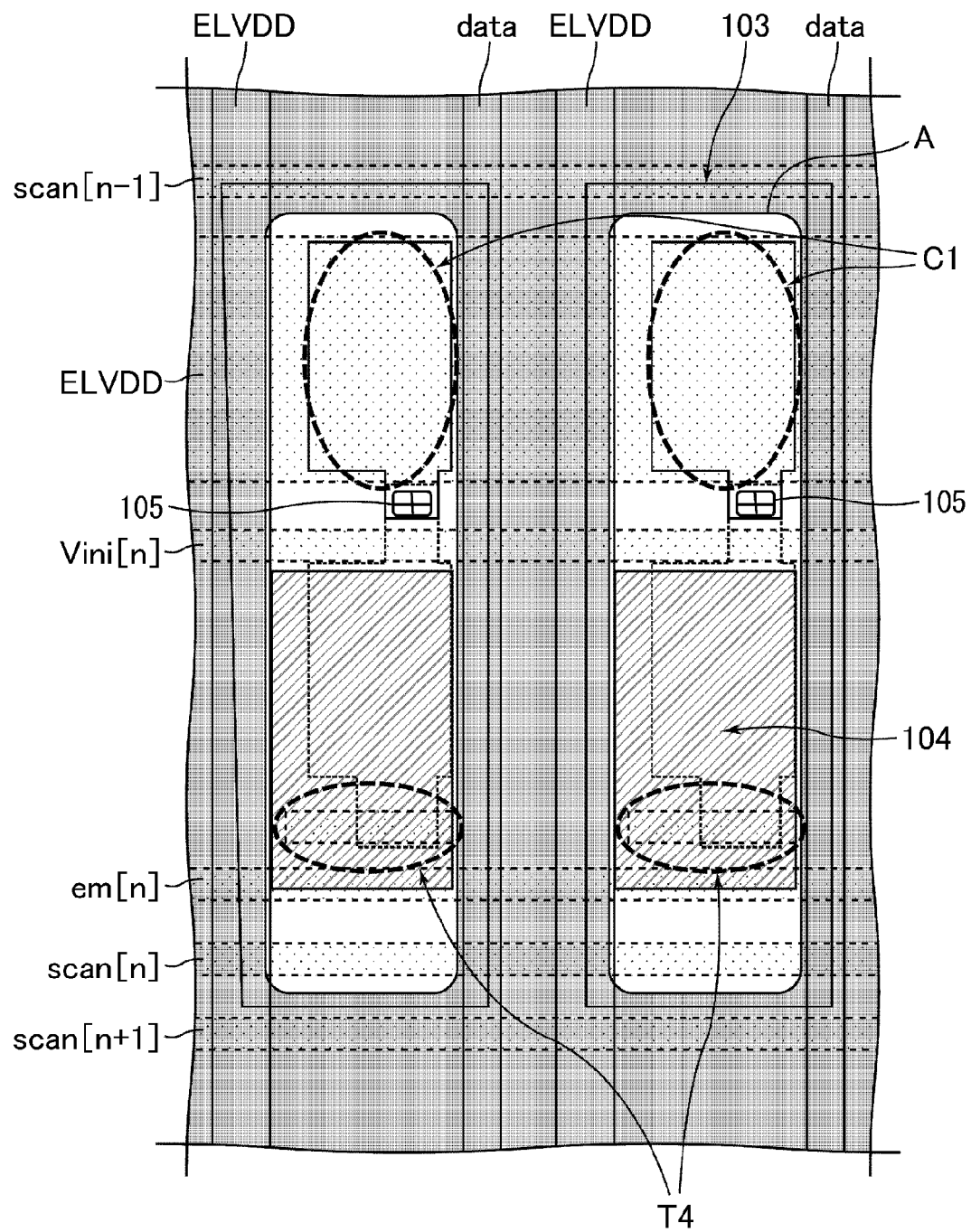
FIG. 7 is a plan-view schematic diagram illustrating a pixel in an organic EL display device of Embodiment 4.

FIG. 7 is a plan-view schematic diagram illustrating a pixel in an organic EL display device of Embodiment 4. In the organic EL display device of Embodiment 4, the gate electrode of the transistor that supplies current to the current emissive element is formed in a first wiring layer and a second wiring layer via a contact hole 105.

As illustrated in FIG. 7, the gate electrode forms a region covered with the pixel electrode 103, and is provided in a wiring layer (first wiring layer) that is lower than the wiring layer directly below the pixel electrode 103; as a result, this allows lowering Cad to substantially 0 fF, and suppressing the occurrence of a step-like response characteristic.

Also, capacitance (capacitor C1 formed through overlap of the gate electrode and the power source line ELVDD) that is formed between the wiring layers can be formed without problems by virtue of the present configuration wherein part of the gate electrode (portion formed at the second wiring layer) forms a region covering the power source line ELVDD that is formed at the first wiring layer.

In FIG. 7, the shield electrode 104 is provided in a wiring layer (second wiring layer) between the pixel electrode 103 and a wiring layer (first wiring layer) in which part of the gate electrode (i.e. portion formed at the first wiring layer) is provided, such that the shield electrode 104 forms a region covering part of the gate electrode (i.e. portion provided in the first wiring layer).

Forming thus the shield electrode 104 at the second wiring layer above the gate electrode allows preventing, yet more thoroughly, susceptibility to the influence of the electrodes at both ends where Cad is formed.

An organic EL display device having excellent display performance can be realized as a result.

In the explanation above, TFTs and so forth have been omitted in the figures, for the sake of an easier comprehension of the characterizing features of the embodiments. In all embodiments, however, the compensation circuit comprises a plurality of TFTs. The gate electrode of T4 forms capacitance with the second wiring layer, but, in addition, can form capacitance with a semiconductor layer. In Embodiments 1 and 3, for instance, the gate electrode 102 of T4 can form capacitance with a semiconductor layer.

The aforementioned modes of the embodiments may be employed in appropriate combination as long as the combination is not beyond the spirit of the present invention.

The present application claims priority to Patent Application No. 2009-241319 filed in Japan on Oct. 20, 2009 under the Paris Convention and provisions of national law in a designated State, the entire contents of which are hereby incorporated by reference.

Explanation of Reference Numerals

T1, T2, T3, T4, T5, T6: transistor
C1, C2: capacitor
OLED: organic EL element
scan[n−1], scan[n], scan[n+1]: scanning line
Vini[n]: initialization voltage line
em[n]:emission control line
ELVDD, ELVSS: power source line
data: signal line
A: opening
100: substrate
101: semiconductor layer
102: gate electrode
103: pixel electrode (anode)
104: shield electrode
105: contact hole
110, 111, 112: interlayer dielectric
113: edge cover

The invention claimed is:

1. An active matrix substrate driven by an analog gray scale method, comprising:
   a substrate,
   an organic EL element,
   a power source line,
   a transistor that supplies current to the organic EL element from the power source line, and
   a compensation circuit for compensating variability of the threshold voltage in the transistor,
   wherein the organic EL element has a pixel electrode electrically connected to the transistor,
   a gate electrode of the transistor is provided in a first wiring layer and a second wiring layer,
   a portion of the gate electrode in the first wiring layer is covered with the pixel electrode,
   a portion of the gate electrode in the second wiring layer covers the power source line,
   the portions of the gate electrode in the first wiring layer and the second wiring layer are connected via a contact hole provided in an insulating layer,
   the first wiring layer is a layer closer to the substrate than the second wiring layer, and
   the second wiring layer is a layer closer to the substrate than the pixel electrode.

2. The active matrix substrate according to claim 1, wherein a shield electrode is provided in a wiring layer between the pixel electrode and the first wiring layer, and the portion of the gate electrode in the first wiring layer is covered with the shield electrode.

3. The active matrix substrate according to claim 2, wherein the shield electrode is provided in the second wiring layer.

4. An organic EL display device, comprising the active matrix substrate according to claim 1,
   wherein
   the pixel electrode is an anode or cathode.

* * * * *